United States Patent
Li et al.

(10) Patent No.: US 9,654,025 B2
(45) Date of Patent: May 16, 2017

(54) METHOD FOR DESIGNING CASCADED MULTI-LEVEL INVERTER WITH MINIMIZED LARGE-SCALE VOLTAGE DISTORTION

(71) Applicant: Shanghai Jiao Tong University, Shanghai (CN)

(72) Inventors: Guojie Li, Shanghai (CN); Xiuchen Jiang, Shanghai (CN); Keyou Wang, Shanghai (CN); Lin Feng, Shanghai (CN); Bei Han, Shanghai (CN); Lijun Hang, Shanghai (CN)

(73) Assignee: Shanghai Jiao Tong University, Shanghai (CN)

( * ) Notice: Subject to any disclaimer, the term of this patent is extended or adjusted under 35 U.S.C. 154(b) by 363 days.

(21) Appl. No.: 14/569,609

(22) Filed: Dec. 12, 2014

(65) Prior Publication Data

US 2015/0357933 A1 Dec. 10, 2015

(30) Foreign Application Priority Data

Jun. 5, 2014 (CN) .......................... 2014 1 0245719

(51) Int. Cl.
*H02M 7/23* (2006.01)
*G06F 17/10* (2006.01)
*G06F 17/50* (2006.01)
*H02M 1/088* (2006.01)
*H02M 7/49* (2007.01)
*H02M 1/00* (2006.01)

(52) U.S. Cl.
CPC .............. *H02M 7/23* (2013.01); *G06F 17/10* (2013.01); *G06F 17/50* (2013.01); *G06F 17/5063* (2013.01); *H02M 1/088* (2013.01); *H02M 7/49* (2013.01); *H02M 2001/0054* (2013.01); *Y02B 70/1491* (2013.01); *Y10T 307/549* (2015.04)

(58) Field of Classification Search
None
See application file for complete search history.

(56) References Cited

U.S. PATENT DOCUMENTS

2008/0218320 A1* 9/2008 Jang .................. H02M 7/49
363/1
2015/0340964 A1* 11/2015 Modeer ................ H02J 3/383
307/82

* cited by examiner

*Primary Examiner* — Jared Fureman
*Assistant Examiner* — Aqeel Bukhari
(74) *Attorney, Agent, or Firm* — Mei & Mark LLP; Manni Li (57) ABSTRACT

A method for designing cascaded multi-level inverters with minimization of large-scale voltage distortion, based on KKT (Karush-Kuhn-Tucker) conditions and with simplified computation of conduction angles, simplifies the computation process, and is conducive to on-line calculation. Meanwhile, its fundamental voltage is adaptive, minimization of total harmonic is realized for cascaded multi-level inverters at high-voltage, and voltage power quality at grid connected nodes is improved.

2 Claims, 5 Drawing Sheets

METHOD FOR DESIGNING CASCADED MULTI-LEVEL INVERTER WITH MINIMIZED LARGE-SCALE VOLTAGE DISTORTION

CROSS-REFERENCE TO RELATED APPLICATIONS

The subject application claims priority on Chinese Patent Application No. CN201410245719.1 filed on Jun. 5, 2014. The contents and subject matter of the Chinese priority application are incorporated herein by reference.

TECHNICAL FIELD OF THE INVENTION

The present invention relates to electric and electronic technology, and in particular, relates to a method for designing a cascaded multi-level inverter with minimized large-scale voltage distortion.

BACKGROUND OF THE INVENTION

Inverters are used more and more with the development of the electric and electronic technology. Cascaded inverters based on pulse width modulation (PWM) are popular in medium and high power level systems. Cascaded inverters are modulated in high or low frequency according to the switching frequency. Regular high frequency modulation features sinusoidal pulse width modulation (SPWN), selected harmonic elimination PWM (SHEPWM), space vector pulse width modulation (SVPWM), etc. Compared with the high frequency modulation, the low frequency modulation reduces switching loss and switching stress of a device, lengthens its life-time, and increases system efficiency.

In a step modulation, computation of conductance angles of various inverter levels is a research hotspot. Methods for computing conductance angles include: selected harmonic elimination (SHE), equal-area method, minimum area-difference method, and minimum total harmonic distortion (THD). The SHE method aims to eliminate low-order harmonic in a voltage output waveform, but its computation is complicated as a set of multivariate nonlinear transcendental equations need to be solved. The equal-area method requires that, at each specific time interval, the sinusoidal reference voltage equals the integral of the step modulated wave, but it lacks the optimization of the harmonic distortion, and hence the distortion of the amplitude of the voltage base frequency becomes possible. The minimum area-difference method aims at minimizing the integral of the difference between the sinusoidal reference voltage and the step voltage, which again may result in the distortion of the amplitude of the voltage base frequency.

Integration of a large number of inverters brings possible harmonic issues to the system. Total harmonic distortion is an important parameter for assessing the quality of the output waveform of the inverter, therefore, the investigation of the cascaded multi-level inverters with minimization of distortion is an urgent task. However, the cascaded inverters in the existing technology have big distortion and affect power quality at the nodes of integration.

SUMMARY OF THE INVENTION

An object of the present invention is to provide a method for designing cascaded multi-level inverters with minimized large-scale voltage distortion. The method of the present invention is based on KKT (Karush-Kuhn-Tucker) conditions; it simplifies the computation for conduction angles and the computation process, and is friendly to on-line calculation. Meanwhile, its fundamental voltage is adaptive, minimization of total harmonic is realized for cascaded multi-level inverters at high-voltage, and voltage power quality at grid connected nodes is improved.

The technical solution of the present invention is as follows:

A method for designing cascaded multi-level inverters with minimization of large-scale voltage distortion, the design method of the present invention comprises the following steps: determining N as a number of inverter modules and DC voltage sources in a cascaded multi-level inverter based on a maximum inverter level of the cascaded multi-level inverter H, a step series S, and an inverter level j; applying N inverter modules and DC voltage sources in the cascaded multi-level inverter; connecting a positive electrode of a DC bus of each of the inverter modules with a positive electrode of a corresponding DC voltage source; connecting a negative electrode of the DC bus of each of the inverter modules with a negative electrode of the corresponding DC voltage source; connecting an input control terminal for a conduction angle of the inverter module with a corresponding output control terminal of a controller; connecting an AC output terminal of the inverter module with an AC voltage input terminal corresponding to the controller; and connecting the AC voltage input terminal of the controller with the AC output terminal of the corresponding inverter module. The number of inverter modules and DC voltage sources in the cascaded multi-level inverter, N, is determined by 1) computing lower boundary points $M_{min}(S)$ of a modulation coefficient m according to the equation $$M_{min}(S) = \frac{4}{\pi} \sum_{j=1}^{S} \sqrt{1 - \left(\frac{2j-1}{2S-1}\right)^2}$$

under the condition of $\lambda \geq 2S-1$ where S is a step series, $S=1, 2, \ldots, H$, H is a maximum inverter level of the cascaded multi-level inverter, and j is an inverter level;

2) selecting a step series $S_0$, wherein the modulation coefficient m fulfills $m \in (M_{min}(S_0), M_{min}(S_0+1)]$, when the modulation coefficient m falls into an interval $(0, M_{min}(H+1)]$, $S_0$ satisfies $$\sum_{j=1}^{S_0} \sqrt{1 - \left(\frac{2j-1}{\lambda}\right)^2} = \frac{\pi}{4}m;$$

and when m falls into an interval $$\left(M_{min}(H+1), \frac{4H}{\pi}\right],$$

$S_0$ is selected so that $S_0 = H$ with j being the inverter level, $j=0, 1, 2, \ldots, H$, and $\lambda$ being a parameter;

3) computing $\lambda$ according to the formula $$\sum_{j=1}^{S_0} \sqrt{1 - \left(\frac{2j-1}{\lambda}\right)^2} = \frac{\pi}{4}m;$$

4) computing a sinusoidal value for each conductance angle $\theta_j$ according to the formula $$\sin\theta_j^* = \frac{2j-1}{\lambda}, \; j \in \overline{J}(\theta^*),$$

where $j=1, 2, \ldots, H$, and the sinusoidal value is set to be 1 if it exceeds 1;

5) determining the conductance angle $\theta_j$, $j=1, 2, \ldots, H$ for each the inverter level via an inverse trigonometric function;

6) determining the number N of the inverter module and of the DC voltage source according to the equation $H=2^N-1$.

Further, the present invention provides a cascaded multi-level inverter that is designed by the method of the present invention. The cascaded multi-level inverter comprises inverter modules, a number of the inverter modules being N, each of the inverter modules having 4 full-control switching devices, an H bridge having anti-parallel diodes, a control terminal for a conduction angle of the inverter module, an AC output terminal, and a DC bus, and the DC bus having a positive electrode and a negative electrode; direct-current (DC) voltage sources, a number of the direct-current voltage sources being N, and each of the DC voltage sources having a positive electrode and a negative electrode; and a controller having a control terminal for output conducting signals and an AC voltage input terminal. The positive electrode of the DC bus of each of the inverter modules is connected with the positive electrode of a corresponding DC voltage source; the negative electrode of the DC bus of each of the inverter modules is connected with the negative electrode of the corresponding DC voltage source; the input control terminal for the conduction angle of the inverter module is connected with the corresponding output control terminal of the controller; the AC output terminal of the inverter module is connected with the AC voltage input terminal corresponding to the controller;

Compared with the prior art, the present invention features the following:

1. The design method of cascaded multi-level inverter for minimization of large-scale voltage distortion of the present invention is a step modulation algorithm based on Karush-Kuhn-Tucker (KKT) conditions. It gives a method of computation for the corresponding conductance angles via strict mathematical deductions, and thus obtains an analytical expression of the total harmonic. The proposed step modulation strategy may minimize total harmonic distortion under any modulation coefficient. It has strict mathematical deductions and simple algorithm; it is adaptive to a large range of voltage, and provides a scientific foundation for online computation of conductance angles and for controlling of total harmonic of cascaded multi-level inverters. The proposed cascaded multi-level inverter for minimization of large-scale voltage distortion is characterized in small harmonic in a large range of fundamental voltage.

2. The computation is highly convenient, which significantly reduces computational work.
3. It is adaptable to a wide range of fundamental voltage.
4. It improves power quality at grid connected nodes.

DETAILED DESCRIPTION OF THE INVENTION AND EMBODIMENTS

With references to drawings and embodiments hereinafter provided in a non-limiting way, the present invention will be further explained.

The underlying principle of the present invention is described below.

The voltage total harmonic distortion (THD) of the cascaded multi-level inverter for minimization of large-scale voltage distortion according to the present invention is expressed by formula (1) to be shown below. The problem we are facing is: with a specific modulation coefficient m and under the condition of minimum total harmonic distortion, a set of conductance angles $\theta_k$, $k=1, 2, \ldots, 2^N-1$ are to be obtained.

$$THD = \sqrt{\frac{\sum_{n=3}^{+\infty} U_n^2}{U_1^2}} \qquad (1)$$

$$= \sqrt{\frac{\sum_{n=1}^{+\infty} U_n^2 - U_1^2}{U_1^2}}$$

$$= \sqrt{\frac{2}{m^2}\left[F^2 - \frac{2}{\pi}\sum_{k=1}^{F}(2k-1)\theta_k\right] - 1}$$

where m is the modulation coefficient, $U_n$ is the component of the $n^{th}$ harmonic, F stands for the maximum number of inverter levels in the positive half cycle, $\theta_k$ signifies the conductance angle of the output voltage step-jumping from $(k-1)V_{bs}$ to $kV_{bs}$, and $V_{bs}$ represents the voltage value of the minimum DC voltage source.

Let $V_{bs}=1$, and the maximum number of the inverter levels of the cascaded multi-level inverter $H=2^N-1$. The equivalent of the aforementioned problem is the following optimization problem:

$$\min f(\theta) = -\sum_{k=1}^{H}(2k-1)\theta_k \qquad (2)$$

$$\text{subject to } h(\theta) = m\frac{\pi}{4} - \sum_{k=1}^{H}[\cos(\theta_k)] = 0 \qquad (3)$$

-continued $$g_0(\theta) = -\theta_1 \leq 0 \quad (4)$$

$$g_j(\theta) = \theta_j - \theta_{j+1} \leq 0, j = 1, 2, \ldots, H-1 \quad (5)$$

$$g_H(\theta) = \theta_H - \frac{\pi}{2} \leq 0 \quad (6)$$

where $\theta = [\theta_1, \theta_2 \ldots \theta_H]^T$, $f(\theta)$, $g(\theta)$ and $h(\theta)$ are all continuous derivable functions with respect to $\theta$;

Let $\theta^*$ be a local extreme point of $f(\theta)$, then there exists a $\lambda$ and $\mu_j \geq 0 (j=0, 1, 2, \ldots, H)$ satisfying:

$$\nabla f(\theta^*) + \lambda \nabla h(\theta^*) + \sum_{j=0}^{H} \mu_j \nabla g_j(\theta^*) = 0 \quad (7)$$

$$\mu_j g_j(\theta^*) = 0, j \in J = \{0, 1, \ldots, H\} \quad (8)$$

For a specific solution $\theta^*$, define effective subset $j(\theta^*) = \{j \in J, g_j(\theta^*) = 0\}$.

It follows from formula (7) that:

$$-(2j-1) + \lambda \sin \theta^*_j - \mu_{j-1} + \mu_j = 0 \quad (9)$$

where $\theta_1, \theta_2, \ldots, \theta_S$ are all non-zeros and different from one another. For any $j > S$, $j \in J(\theta^*)$ and $g_j(\theta^*) = 0$, we have $$\theta^*_{S+1} = \theta^*_{S+2} = \ldots = \theta^*_H = \frac{\pi}{2},$$

S being a step series.

Consider the non-effective subset $\bar{J}(\theta^*) = \{j \leq S \text{ or } j \notin J(\theta^*)\}$, it follows from formula (5) that:

$$\sin \theta^*_j = \frac{2j-1}{\lambda}, j \in \bar{J}(\theta^*) \quad (10)$$

Under the constraint of $h(\theta)$, it follows that $$\sum_{j=1}^{S} \sqrt{1 - \left(\frac{2j-1}{\lambda}\right)^2} = \frac{\pi}{4}m \quad (11)$$

The above formula (10) thus constitutes the basis for designing the conductance angles that minimize the total harmonic of the controller of the cascaded multi-level inverter according to the present invention.

Figure 1:
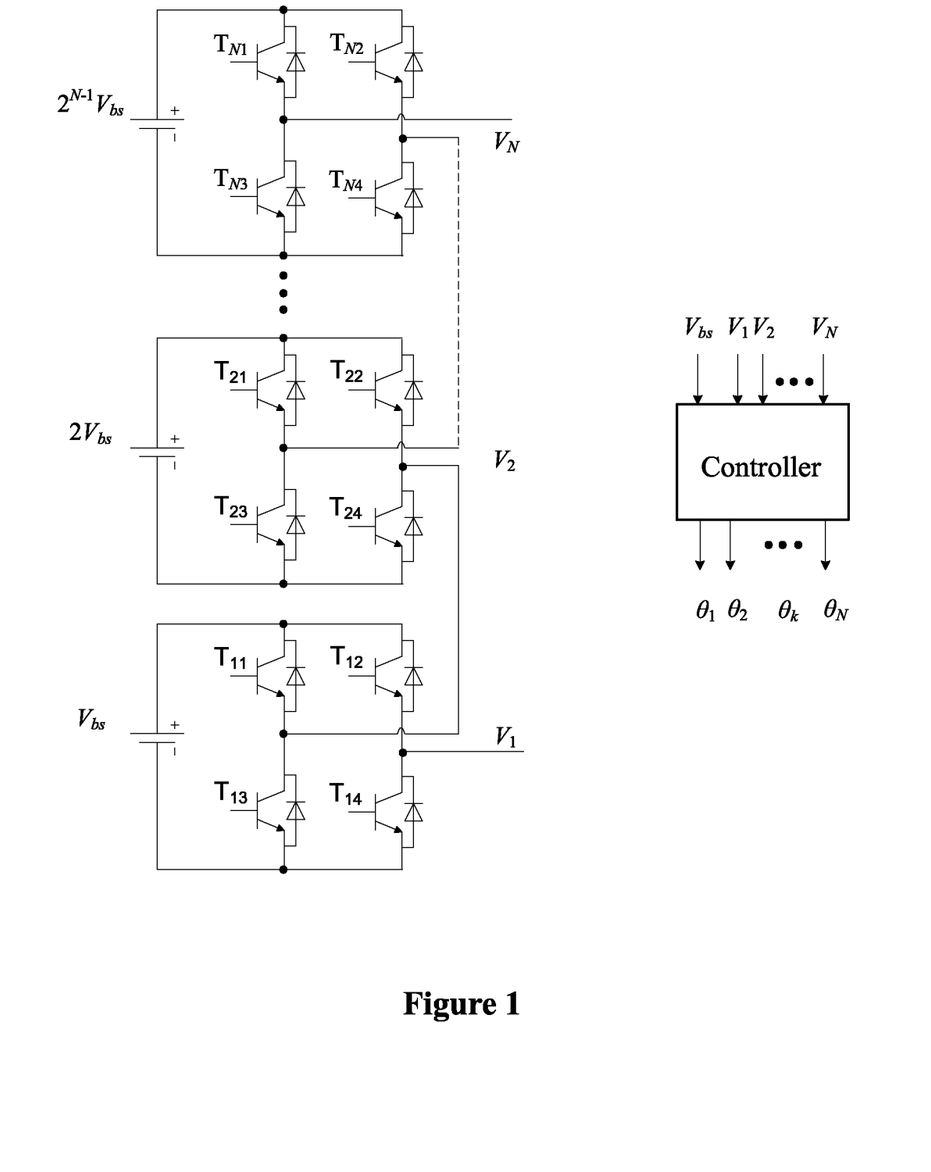
FIG. 1 is a schematic diagram of the cascaded multi-level inverter for minimization of large-scale voltage distortion of the present invention.
Figure 2:
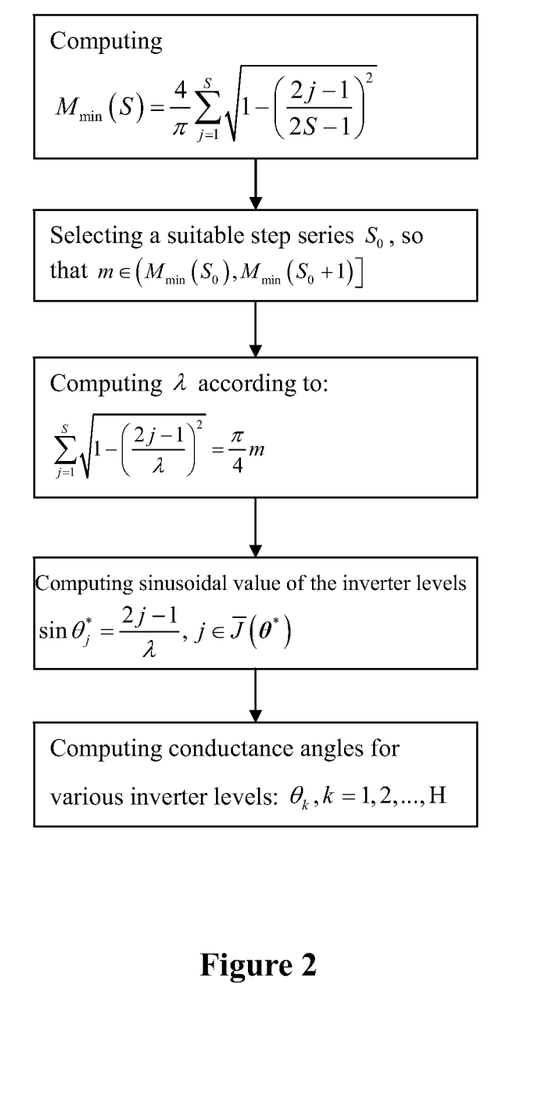
FIG. 2 is a procedure of the computation method of the present invention.

Refer to FIG. 1, it is a single-phase schematic diagram of a cascaded multi-level inverter for minimization of large-scale voltage distortion according to the present invention, illustrating a three-phase case comprising three single phases. FIG. 2 shows the procedure for the computation of conductance angles of the controller of the cascaded multi-level inverter for minimization of large-scale voltage distortion.

The computation method is implemented as follows:

For a specific S, there exists a corresponding modulation coefficient interval M(S) such that equations (10) and (11) are fulfilled. Its lower bound is set as $M_{min}$, and its upper bound as $M_{max}(S)$. For the left side of equation (11) to be a real number, $\lambda \geq 2S-1$ must be satisfied. Accordingly the lower bound of M(S) is $$M_{min}(S) = \frac{4}{\pi} \sum_{j=1}^{S} \sqrt{1 - \left(\frac{2j-1}{2S-1}\right)^2} \quad (12)$$

When M(S) is maximized, $\lambda \to +\infty$. That is, $$M_{max}(S) = \frac{4}{\pi} S \quad (13)$$

When $\Delta = 2S-1$, $$\theta^*_S = \frac{\pi}{2},$$

it is obvious that $$\theta^*_{S+1} = \frac{\pi}{2},$$

and then $g_S(\theta^*) = 0$, $S \in J(\theta^*)$, which contradicts the above assumption. M(S) therefore cannot completely reach its lower bound. While $\lambda \to +\infty$, $\cos \theta^*_1 = \cos \theta^*_2 = \ldots = \cos \theta^*_S = 1$, contradicting the fact that $\theta_1, \theta_2, \ldots, \theta_S$ are non-zeros. M(S) therefore does not contain its upper bound. Hence, the modulation coefficient interval corresponding to S is $M(S) = (M_{min}(S), M_{max}(S))$. When N=4, $H=2^N-1=15$, $M_{min}(S)$ and $M_{max}(S)$ corresponding to each level of S are shown in Table 1.

TABLE 1

| | $M_{min}$ (S) and $M_{max}$ (S) | |
|---|---|---|
| S | $M_{min}$ (S) | $M_{max}$ (S) |
| 1 | 0 | 1.2732 |
| 2 | 1.2004 | 2.5465 |
| 3 | 2.2661 | 3.8197 |
| 4 | 3.3016 | 5.0930 |
| 5 | 4.3247 | 6.3662 |
| 6 | 5.3413 | 7.6394 |
| 7 | 6.3539 | 8.9127 |
| 8 | 7.3639 | 10.1859 |
| 9 | 8.3721 | 11.4592 |
| 10 | 9.3789 | 12.7324 |
| 11 | 10.3848 | 14.0056 |
| 12 | 11.3899 | 15.2789 |
| 13 | 12.3944 | 16.5521 |
| 14 | 13.3984 | 17.8254 |
| 15 | 14.4019 | 19.0986 |
| 16 | 15.4051 | 20.3718 |

For a specific modulation coefficient m, any S' satisfying $m \in M(S')$ is a suitable selection of step series. We may obtain every S' that satisfies $m \in M(S')$, and obtain a $\lambda$ corresponding to m and S' via equation (12), and obtain a set of local optimal solutions $\{\theta^*\}$ by substituting $\lambda$ into (10). This set of local optimal solutions are the candidates for the global optimal solution.

The specific steps for computing conductance angles for minimization of total harmonic distortion are as follows:

1) Computing division points $M_{min}(S)$ according to equation (12), wherein S=1, 2, . . . , H.

2) Selecting a suitable step series $S_0$, wherein the modulation coefficient $m \in (M_{min}(S_0), M_{min}(S_0+1)]$.

3) Computing λ according to equation (11).

4) Computing sinusoidal values for various conductance angles according to equation (10), and let it be 1 if it exceeds 1.

5) Computing conductance angles $\theta_k$, k=1, 2, ..., H for various inverter levels via inverse trigonometric functions.

It should be pointed out that the above algorithm holds only when the modulation coefficient falls into the interval $(0, M_{min}(H+1)]$. When the coefficient is in the interval $$\left( M_{min}(H+1), \frac{4H}{\pi} \right],$$

the solution can only proceed by selecting S=H. We define this interval as the over modulation interval for the step modulation.

Figure 3:
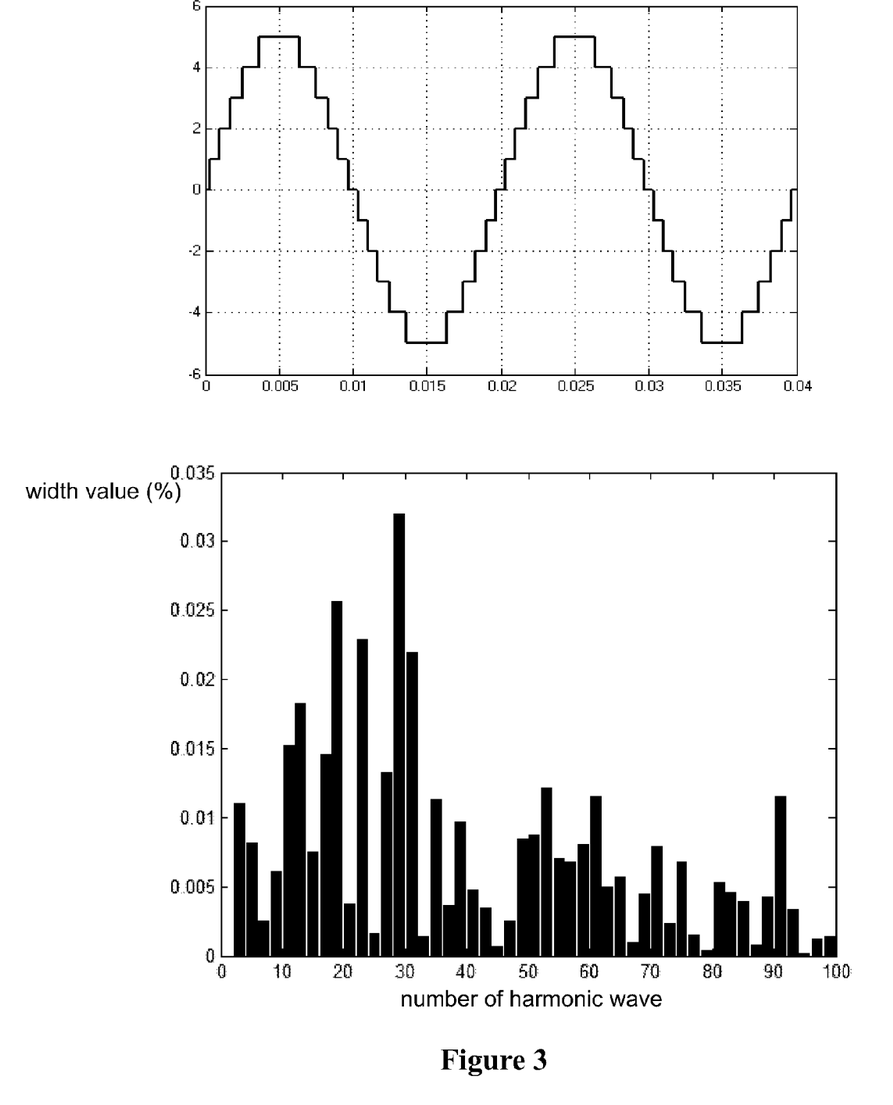
FIG. 3 shows the output voltage and harmonic components at various orders with modulation coefficient m=5.
Figure 4:
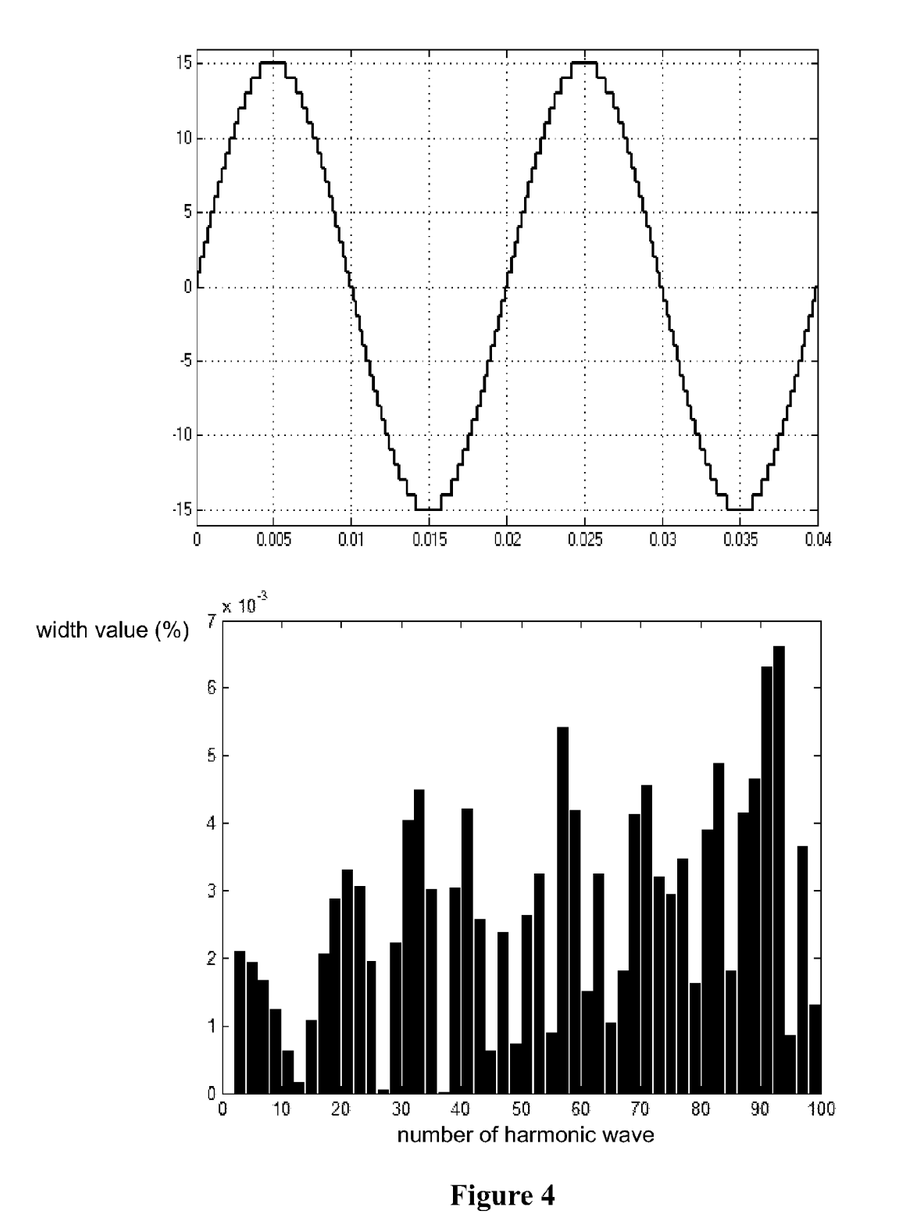
FIG. 4 shows the output voltage and harmonic components at various orders with modulation coefficient m=15.
Figure 5:
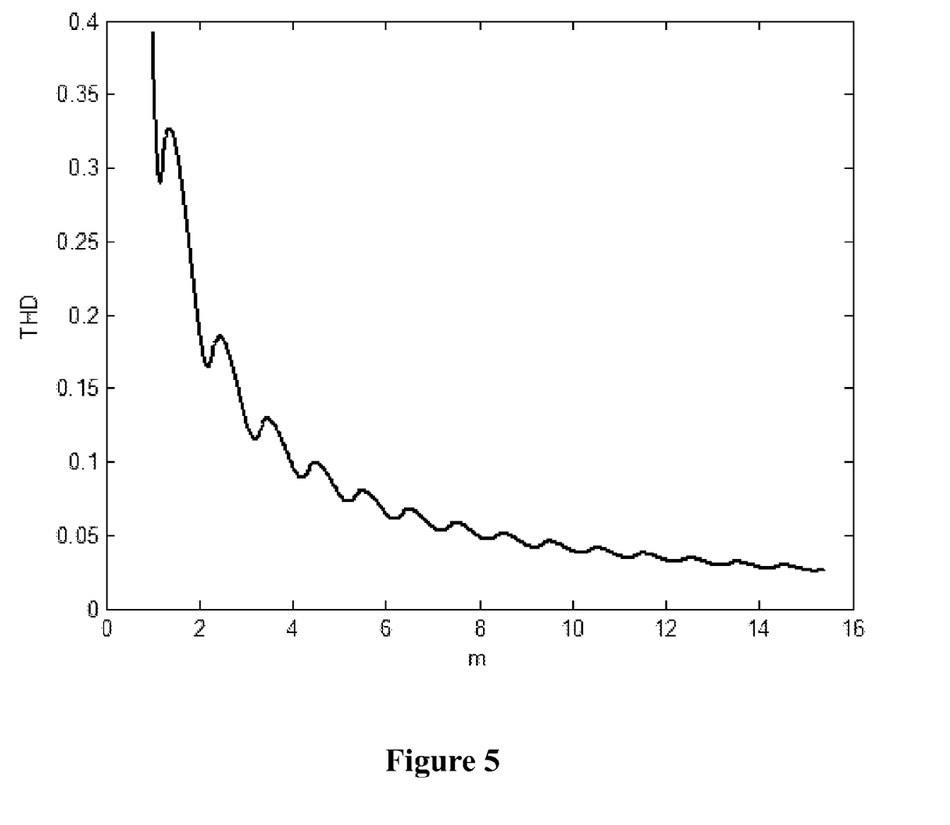
FIG. 5 shows a curve of distortion of total harmonic varying with modulation coefficient.

With the analytical computing formula (10), harmonic components of various orders for the output voltage of a cascaded multi-level inverter corresponding to a modulation coefficient can be computed. FIG. 3 shows the output voltage with its harmonic components at various orders with modulation coefficient m=5. FIG. 4 shows the output voltage with its harmonic components at various orders with modulation coefficient m=15. FIG. 5 shows a curve of distortion of total harmonic of the output voltage of a cascaded multi-level inverter varying with modulation coefficient. Accordingly, the present invention discloses a simple and accurate analytical formula for computing output voltage THD of a cascaded multi-level inverter, suitable for online computation of conductance angles.

We claim:

1. A method of designing a cascaded multi-level inverter for minimized large-scale voltage distortion, comprising:

determining N as a number of inverter modules and DC voltage sources in a cascaded multi-level inverter based on a maximum inverter level of the cascaded multi-level inverter H, a step series S, and an inverter level j;

applying N inverter modules and DC voltage sources in the cascaded multi-level inverter;

connecting a positive electrode of a DC bus of each of the inverter modules with a positive electrode of a corresponding DC voltage source;

connecting a negative electrode of the DC bus of each of the inverter modules with a negative electrode of the corresponding DC voltage source;

connecting an input control terminal for a conduction angle of the inverter module with a corresponding output control terminal of a controller;

connecting an AC output terminal of the inverter module with an AC voltage input terminal corresponding to the controller; and connecting the AC voltage input terminal of the controller with the AC output terminal of the corresponding inverter module, wherein N is determined by computing lower boundary points $M_{min}(S)$ of a modulation coefficient m according to an equation $$M_{min}(S) = \frac{4}{\pi} \sum_{j=1}^{S} \sqrt{1 - \left(\frac{2j-1}{2S-1}\right)^2}$$

under a condition of λ≥2S−1, wherein S is the step series and S=1, 2, ..., H, H is the maximum inverter level of a cascaded multi-level inverter, and j is the inverter level;

selecting a step series $S_0$, wherein the modulation coefficient m fulfills $m \in (M_{min}(S_0), M_{min}(S_0+1)]$, when the modulation coefficient m falls into an interval $(0, M_{min}(H+1)]$, $S_0$ satisfies $$\sum_{j=1}^{S_0} \sqrt{1 - \left(\frac{2j-1}{\lambda}\right)^2} = \frac{\pi}{4}m,$$

and when m falls into an interval $$\left( M_{min}(H+1), \frac{4H}{\pi} \right],$$

$S_0$ is selected so that $S_0$=H, with j being the inverter level, j=0, 1, 2, ..., H, and λ being a parameter;

computing λ according to the formula $$\sum_{j=1}^{S_0} \sqrt{1 - \left(\frac{2j-1}{\lambda}\right)^2} = \frac{\pi}{4}m;$$

computing a sinusoidal value for each conductance angle $\theta_j$ according to a formula $$\sin\theta_j^* = \frac{2j-1}{\lambda}, \ j \in \overline{J}(\theta^*),$$

where j=1,2, ...,H, and the sinusoidal value is set to be 1 if it exceeds 1;

determining the conductance angle $\theta_j$, j=1,2, ...,H for each of the inverter levels via an inverse trigonometric function; and determining N according to an equation $H = 2^N - 1$.

2. A cascaded multi-level inverter designed by the method as described in claim 1, comprising:

inverter modules, a number of the inverter modules being N, each of the inverter modules having 4 full-control switching devices, an H bridge having anti-parallel diodes, a control terminal for a conduction angle of the inverter module, an AC output terminal, and a DC bus, and the DC bus having a positive electrode and a negative electrode, direct-current (DC) voltage sources, a number of the direct-current voltage sources being N, and each of the DC voltage sources having a positive electrode and a negative electrode, and a controller having a control terminal for output conductance signals and an AC voltage input terminal, wherein the positive electrode of the DC bus of each of the inverter modules is connected with the positive electrode of a corresponding DC voltage source;

the negative electrode of the DC bus of each of the inverter modules is connected with the negative electrode of the corresponding DC voltage source;

the input control terminal for the conduction angle of the inverter module is connected with the corresponding output control terminal of the controller;

the AC output terminal of the inverter module is connected with the AC voltage input terminal corresponding to the controller; and the AC voltage input terminal of the controller is connected with the AC output terminal of the corresponding inverter module.

* * * * *